(12) United States Patent
Paviet-Salomon et al.

(10) Patent No.: US 8,969,186 B2
(45) Date of Patent: Mar. 3, 2015

(54) METHOD FOR PRODUCING A PHOTOVOLTAIC CELL HAVING A SELECTIVE EMITTER

(71) Applicant: Commissariat a L'Energie Atomique et aux Energies Alternatives, Paris (FR)

(72) Inventors: Bertrand Paviet-Salomon, Lyon (FR); Samuel Gall, Arradon (FR); Sylvain Manuel, Montgardin (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/075,138

(22) Filed: Nov. 8, 2013

(65) Prior Publication Data

US 2014/0087511 A1     Mar. 27, 2014

Related U.S. Application Data

(63) Continuation of application No. PCT/FR2012/050932, filed on Apr. 26, 2012.

(30) Foreign Application Priority Data

Jun. 17, 2011   (FR) .................................. 11 55352

(51) Int. Cl.
*H01L 21/22*       (2006.01)
*H01L 31/18*       (2006.01)
*H01L 31/0216*    (2014.01)
*H01L 31/068*     (2012.01)
(Continued)

(52) U.S. Cl.
CPC ...... *H01L 31/1868* (2013.01); *H01L 31/02168* (2013.01); *H01L 31/1804* (2013.01); *H01L 31/1864* (2013.01); *H01L 31/068* (2013.01); *H01L 21/2254* (2013.01); *H01L 21/268* (2013.01); *Y02E 10/52* (2013.01); *Y02E 10/547* (2013.01)
USPC ............................................. 438/558; 438/72

(58) Field of Classification Search
USPC ............................................. 438/558, 72, 73
See application file for complete search history.

(56) References Cited

FOREIGN PATENT DOCUMENTS

FR      2 943 180         9/2010
WO      00/01019          1/2000

OTHER PUBLICATIONS

International Search Report, International Application No. PCT/FR2012/050932, dated Sep. 10, 2012 (2 pages).

(Continued)

*Primary Examiner* — Reema Patel
(74) *Attorney, Agent, or Firm* — Burr & Brown, PLLC

(57) ABSTRACT

A method for manufacturing a photovoltaic cell with a selective emitter, including the steps of: depositing an antireflection layer including n-type dopants on an n- or p-type silicon substrate, said deposition being, performed in the presence of a chemical compound that accelerates the diffusion of n-type dopant atoms in said substrate; overdoping at least one area of the substrate to form at least one $n^{++}$ overdoped emitter by local diffusion of the n dopants of at least one area of the antireflection layer; depositing at least one n-type conductive material on the at least one $n^{++}$ overdoped emitter; and at least one p-type conductive material on the surface of the substrate opposite to that including the antireflection layer; forming the n contacts and the p contacts simultaneously to the forming of an $n^+$ emitter by an anneal capable of diffusing within the substrate n dopants from the antireflection layer.

14 Claims, 2 Drawing Sheets

(51) Int. Cl.
*H01L 21/225* (2006.01)
*H01L 21/268* (2006.01)

(56) References Cited

OTHER PUBLICATIONS

J. C.C. Tsai, "Shallow Phosphorus Diffusion Profiles in Silicon," Proc. of the IEEE 57 (9), 1969, pp. 1499-1506.

A. Ogane et al., "Laser-Doping Technique Using Ultraviolet Laser for Shallow Doping in Crystalline Silicon Solar Cell Fabrication," Jpn. J. Appl. Phys. 48 (2009) 071201.

B. Sopori et al., "Fundamental Mechanisms in the Fire-Through Contact Metallization of Si Solar Cells: A Review," 17th Workshop on Crystalline Silicon Solar Cells & Modules: Materials and Process, Vail, Colorado, USA, Aug. 5-8, 2007.

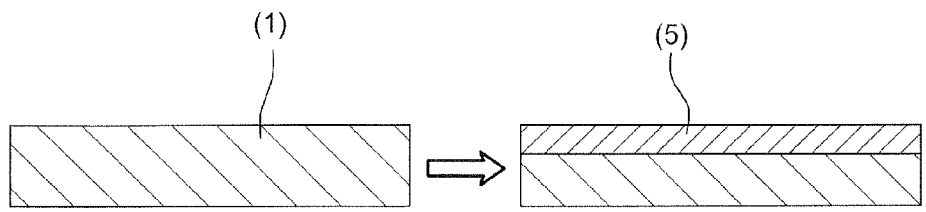
Fig. 1A
PRIOR ART
Fig. 1B
PRIOR ART
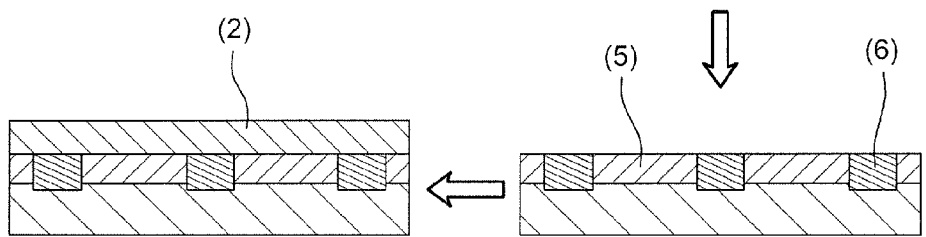
Fig. 1D
PRIOR ART
Fig. 1C
PRIOR ART
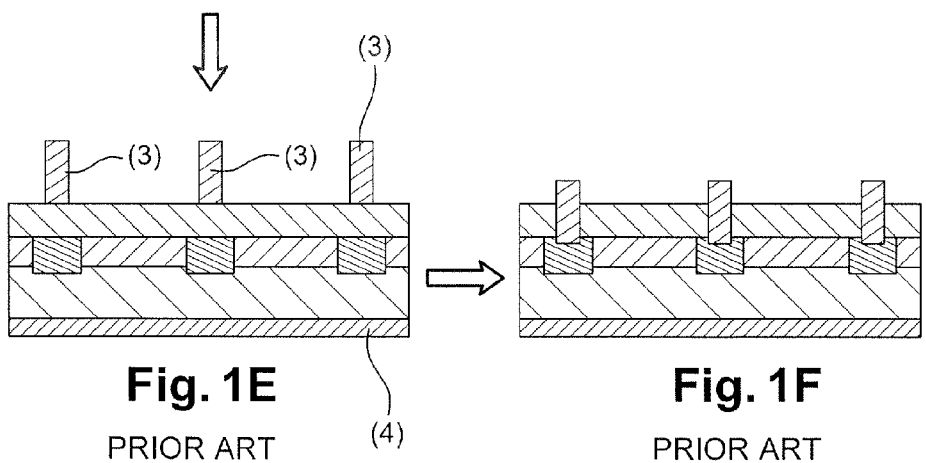
Fig. 1E
PRIOR ART
Fig. 1F
PRIOR ART

Fig. 2D  Fig. 2C

METHOD FOR PRODUCING A PHOTOVOLTAIC CELL HAVING A SELECTIVE EMITTER

FIELD OF THE INVENTION

The invention relates to a method for manufacturing a photovoltaic cell with a selective emitter comprising an n- or p-doped silicon substrate, as well as areas of low and of high n doping.

The present invention also relates to the production of electric power from solar power, and more particularly photons.

BACKGROUND

The operation of a photovoltaic cell is mainly based on the absorption of photons generating the transiting of electrons between the valence band and the conduction band of a material having semiconductor properties, forming the cell. Such an electron transfer is made possible due to the doping of the material forming the photovoltaic cell, to create areas having an excess of electrons (n doping) as well as areas lacking electrons (p doping).

Generally, a photovoltaic cell comprises a p-doped silicon substrate covered with an n-doped silicon layer. Such a stack forms a pn junction necessary for the collection of photocarriers generated by the exposure of the photovoltaic cell to sunlight. The n-doped silicon layer is further covered with an antireflection layer ensuring a good photon absorption. The latter comprises electric contacts enabling to collect the generated current.

However, certain constraints should be respected, the n doping areas simultaneously having to:
ensure a good ohmic contact with the electric contacts, and thus have a high doping level;
ease the passivation of the material by means of the antireflection layer, and thus have a low doping rate to limit Auger recombinations, which are associated with a high doping rate.

Accordingly, photovoltaic cells called selective-emitter cells have been developed. Such cells have areas of strong n doping as well as areas of low n doping in an n-type or p-type substrate.

Selective-emitter photovoltaic cells of prior art (FIG. 1F) thus comprise an area of low n doping, also called $n^+$ area or region or $n^+$ emitter. Further, in this type of photo-voltaic cell, the emitter also comprises areas of strong n doping ($n^{++}$ regions or $n^{++}$ emitters) precisely defined to form electric contacts. The $n^+$ emitter thus eases the passivation by the antireflection layer and decreases Auger recombinations while the $n^{++}$ emitter is connected to the electric contacts to provide a good ohmic contact.

Typically, methods for manufacturing such a photovoltaic cell with a selective emitter according to prior art comprise the steps of:
forming an $n^+$ emitter by gaseous diffusion of a dopant ($POCl_3$) in a p-doped silicon substrate (J. C.C. Tsai, "*Shallow Phosphorus Diffusion Profiles in Silicon*", Proc. of the IEEE 57 (9), 1969, pp. 1499-1506). This step implies maintaining the substrate at a temperature close to from 850 to 950° C. for several tens of minutes (FIGS. 1A and 1B);
forming an $n^{++}$ emitter by laser doping (A. Ogane et al, "*Laser-Doping Technique Using Ultraviolet Laser for Shallow Doping in Crystalline Silicon Solar Cell Fabrication*", Jpn. J. Appl. Phys. 48 (2009) 071201), or by a second gaseous diffusion of a dopant ($POCl_3$) at a temperature higher than that involved in the case of the $n^+$ emitter (FIG. 1C). Certain specific areas of the $n^+$ emitter will be overdoped;
deposition of an antireflection layer, typically silicon nitride, by PECVD ("Plasma Enhanced Chemical Vapor Deposition") (FIG. 1D);
forming the electric contacts by:
deposition of a metallization gate (n contact) on the upper surface of the substrate. It typically is a silk screening paste containing silver. The patterns of this metallization gate are precisely aligned on the $n^{++}$ emitters to avoid short-circuiting the $n^+$ emitter on annealing of the contacts (FIG. 1E). Indeed, if the metallization shifts above the n area, since the latter is thin, on anneal, the metal may cross it and put the $n^+$ area in contact with the substrate.
deposition of a paste containing aluminum (p contact) over the entire lower surface of the substrate. It enables, on the one hand, to ensure the contact with the p-doped portion of the photovoltaic cell and, on the other hand, to improve the electric properties thereof by BSF ("Back Surface Field"), that is, by field-effect passivation (FIG. 1E). It is a heavily p-doped layer, enabling to repel electrons away from the surface and to decrease the electron-hole recombination speed, and this, to improve the cell efficiency:
forming of the electric contacts by simultaneous anneal of the pastes (silver and aluminum) in a continuous furnace, for example, at a 885° C. temperature and with a 6,500 mm/min belt speed (B. Sopori et al, "*Fundamental mechanisms in the fire-through contact metallization of Si solar cells: a review*", 17th Workshop on Crystalline Silicon Solar Cells & Modules: Materials and Process, Vail, Colo., USA, Aug. 5-8 2007). The anneal step is highly critical, since it must be ensured that in a single step, a good ohmic contact is achieved at the upper and lower surfaces of the substrate, and that the passivation of the lower surface is performed by BSF effect (FIG. 1F).

In prior art methods, and as for example described in document FR 2943180 and WO 00/01019, the step of forming the $n^+$ emitter and that of annealing the n contacts and the p contacts are incompatible and thus cannot be carried out simultaneously. Indeed, the step of forming the $n^+$ emitter by gaseous diffusion of a dopant ($POCl_3$) is relatively long (several tens of minutes), and would result in short-circuiting the areas under the electric contacts if it was performed after deposition of said contacts. On the other hand, the pastes used in silk screening, which is the method used to form the electric contacts, are incompatible with furnaces used for the diffusion of dopants, since they involve large quantities of metals which would irremediably pollute the diffusion furnaces.

Prior art methods thus comprise incompatible steps, each requiring a very specific energy input. On the contrary, the present invention enables to decrease such energy constraints by combining certain steps of the manufacturing of a selective-emitter photovoltaic cell.

DISCUSSION OF THE INVENTION

The Applicant has developed a method for manufacturing a photovoltaic cell with a selective emitter, where the $n^+$ emitter, the n contacts, the p contacts, and the BSF effect are simultaneously achieved during a single anneal step. Thus, the invention enables to overcome certain problems of prior art linked to the incompatibility of the anneal and n dopant diffusion steps.

More specifically, the present invention relates to a method for manufacturing a photovoltaic cell with a selective emitter comprising the steps of:

depositing an antireflection layer comprising n-type dopants on an n- or p-type silicon substrate, said deposition being performed in the presence of a chemical compound enabling to accelerate the diffusion of n-type dopant atoms in the n-type silicon substrate;

overdoping at least one area of the substrate to form at least one $n^{++}$ overdoped emitter by local diffusion of the n dopants of at least one area of the antireflection layer;

depositing:
at least one n-type conductive material on the at least one $n^{++}$ overdoped emitter;
at least one p-type conductive material on the surface of the substrate opposite to that comprising the antireflection layer;

forming the n contacts and the p contacts simultaneously to the forming of an $n^+$ emitter by an anneal capable of diffusing within the substrate n dopants from the antireflection layer.

During the anneal which particularly provides the forming of the n contacts and of the p contacts, the n dopants of the $n^{++}$ overdoped emitters may also diffuse. Accordingly, the resulting contact is even deeper.

"Local diffusion" means that only the n dopants of at least one specific area of the anti-reflection layer are diffused to form $n^{++}$ regions forming the $n^{++}$ emitters. Further, during the step of anneal of the electric contacts, and thus of the forming of the $n^+$ emitter, the at least one area of the antireflection layer having n dopants which have diffused to form the $n^{++}$ areas does not take part in the forming of the $n^+$ emitter.

The silicon type is defined by the metallurgy of the original ingot of the substrate used in the crystallization. Typically, the p-type silicon is boron-doped and the n-type silicon is phosphorus-doped.

According to a particularly preferred embodiment, the antireflection layer is made of silicon nitride, advantageously by PECVD ("Plasma Enhanced Chemical Vapor Deposition"). Further, it is n doped, preferably with phosphorus, generally during the deposition, for example, by means of a dopant gas. After the anneal step, which in particular ensures the forming of the n contacts and of the p contacts, the antireflection layer may possibly no longer be doped.

The chemical compound enabling to accelerate the diffusion of n-type dopant atoms advantageously is ammonia. Without developing any theory of any kind, it is possible for the silicon nitride layer obtained in the presence of ammonia, $NH_3$, to be less dense than prior art silicon nitrides, obtained in the presence of nitrogen, $N_2$. The n dopants, phosphorus atoms, may thus move more freely.

The $n^{++}$ areas may be formed in particular by laser doping, advantageously by irradiation by means of a pulsed laser, and more advantageously still of a pulsed laser having a wavelength which may be selected from the range extending from ultraviolet to infrared. According to a preferred embodiment, the laser has a wavelength substantially equal to 515 nm. The laser doping step may result in a partial removal of the antireflection layer.

The $n^{++}$ areas enable to provide a good contact at the upper surface of the substrate, while avoiding any short-circuit. Indeed, the $n^{++}$ areas are very deep and are formed prior to the step of forming of the electric contacts by anneal of the n and p conductive materials. They are located at a depth advantageously greater than 0.5 micrometers with respect to the upper surface of the antireflection layer. They are advantageously deeper than the $n^+$ areas.

During the laser doping step providing the forming of the $n^{++}$ emitter, laser pulses preferably last from 10 ps to 1 µs.

According to an advantageous embodiment, the n and p conductive materials are deposited by silk screening. This technique comprises depositing a paste on the substrate previously covered with a mask. The paste is then pushed by a scraper according to an adjustable speed and pressure. The properties of the mask and especially its thickness are defined according to the electric contacts to be formed. In the case of n contacts, such pastes advantageously contain little glass frit to limit short-circuit risks.

Generally, the substrate has a thickness between 50 micrometers and 500 micrometers while the antireflection layer has a thickness between 20 and 100 nanometers.

Advantageously, in the method according to the present invention, the $n^+$ emitter and the electric contacts are simultaneously formed by anneal in an infrared furnace. This step is preferably carried out at a temperature between 850 and 1,050° C., and at a speed of passage of the substrate in the furnace advantageously between 2,000 and 6,500 mm/min. Further, the transit time in the furnace is advantageously between 1 s and 60 s.

Accordingly, it is particularly advantageous for the dopant source to be air-stable especially to be diffused while the substrate is passing through a furnace.

In the method according to the present invention, the presence of a chemical compound enabling to accelerate the diffusion of n-type dopant atoms is crucial. Indeed, this compound provides a greater mobility in the doping steps, and especially on forming of the electric contacts by anneal of the n and p conductive materials, during which step the $n^+$ emitter is formed by diffusion of the n dopant atoms.

The present invention also relates to a photovoltaic cell capable of being obtained according to the above-described manufacturing method. Such a cell comprises an n- or p-type silicon substrate containing at least:

a p contact positioned on the lower surface of the substrate;
an $n^+$ emitter;
an antireflection layer positioned on the upper surface of the substrate;
at least one $n^{++}$ emitter having an n contact, physically independent from the antireflection layer and the $n^+$ emitter, positioned thereon.

It should be noted that the combination of the steps relating to the diffusion of the $n^+$ emitter and to the forming of the contacts by anneal goes against the teachings of prior art, given that they involve clearly distinct energy constraints. Indeed, the forming of the $n^+$ emitter by diffusion is generally performed in a vacuum furnace at the 850° C. temperature for 30 minutes, while the electric contacts are annealed in free air and at temperatures from 800 to 900° C. for 3 minutes only. Although the temperatures of these two methods remain similar, the respective anneal times vary by a 1/10 ratio. Indeed, the power input necessary for the forming of the n and p electric contacts by anneal of the conductive materials is much lower than that necessary for the forming of the $n^+$ emitter by diffusion. Such a difference can mainly be explained by the fact that dopant particles (and for example, phosphorus) diffuse very slowly in silicon, which requires a very long time to be able to create an $n^+$ emitter sufficiently doped to provide a good efficiency. Conversely, the metal particles ensuring the electric contacts (particularly made of silver or aluminum) diffuse much faster. The forming of the electric contacts by anneal thus requires a lower power input and thus an anneal time shorter than the diffusion of n dopants. It is further important to ascertain that the anneal time remains short to avoid for metal particles to diffuse too deeply and to thoroughly cross the $n^+$ emitter, which would result is a very poor efficiency of the cell (shorted cell).

In prior art methods, and conversely to the present invention, the metal contacts cannot be deposited prior to the forming of the $n^+$ emitter by diffusion in a conventional diffusion tube (i.e. made of quartz and under vacuum). Indeed, this would result in a contamination of the diffusion tube by salting out of the metal particles contained in the contacts, considering the high temperatures used and especially the time necessary for the diffusion process.

In the method according to the present invention, such a combination is made possible by the presence of a chemical compound, advantageously ammonia, enabling to accelerate the diffusion of n dopant atoms in conditions of lower energy. Thus, an $n^+$ emitter of good quality, that is, providing values of Voc>620 mV, may be obtained by diffusion of the atoms, especially phosphorus, during the anneal step, and this despite the short diffusion time as compared with conventional prior art methods. Voc is the open-circuit voltage, it is an electric characteristic of the diode.

It will further be within the abilities of those skilled in the art to adjust the different diffusion and anneal steps according to the composition of the photovoltaic cell. Indeed, the anneal time especially depends on the temperature, but also on the dopant, and on the electric contacts, and vice versa.

The invention and the resulting advantages will better appear from the following non-limiting drawings and examples, in relation with the accompanying drawings.

DESCRIPTION OF THE DRAWINGS

FIGS. 1A to 1F illustrate the steps of the forming of a photovoltaic cells with a selective emitter according to prior art.

FIG. 1F shows a photovoltaic cell with a selective emitter of prior art.

FIGS. 2A to 2E illustrate the steps of the forming of a photovoltaic cells with a selective emitter according to the present invention.

FIG. 2E shows a photovoltaic cell with a selective emitter according to the invention.

DETAILED DESCRIPTION OF THE INVENTION

Figure 2A:
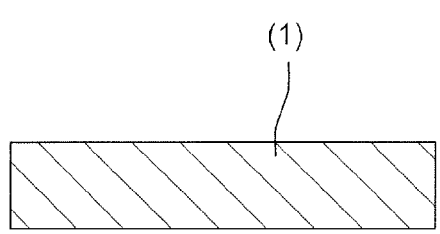

The steps of the method for manufacturing a photovoltaic cell with a selective emitter according to prior art are described hereafter in relation with FIGS. 1A to 1F. These drawings more particularly show the cross-section views of a photovoltaic cell according to prior art in the different manufacturing steps. In this non-limiting example, the substrate is of type p.

FIG. 1A shows a p-type silicon substrate (1).

In FIG. 1B, an $n^+$ emitter (5) is formed by n doping of the substrate (1). It may in particular be a doping by gaseous diffusion in the presence of $POCl_3$, in the case of an n doping with phosphorus. This step thus comprises maintaining the substrate at a temperature from 850 to 950° C., for several tens of minutes, the dopant diffusion being relatively slow.

Then, FIG. 1C illustrates the forming of an $n^{++}$ emitter (6) by laser doping. This step may also be carried out by implementing a second gaseous diffusion of the dopant ($POCl_3$). However, in this case, the temperature would be higher than that for which the $n^+$ emitter (5) of FIG. 1C is formed. Thus, certain areas of the $n^+$ emitter are overdoped.

FIG. 1D shows the deposition of an antireflection layer (2), typically silicon nitride, by PECVD.

The last step of the method according to prior art relates to the forming of electric contacts (3) and (4) such as illustrated in FIGS. 1E and 1F.

First, a metallization gate is deposited on the upper surface of the substrate to prepare the n contacts (3). It typically is a silk screening paste containing silver.

Then, a paste containing aluminum is deposited over the entire lower surface of the substrate to prepare the p contacts (4). Such a paste enables, on the one hand, to form the contact with the p-doped portion of the photovoltaic cell and, on the other hand, to improve the electric properties thereof by BSF.

The forming of the electric contacts is completed by simultaneous anneals of the pastes (silver and aluminum) in a continuous furnace, for example, at a 885° C. temperature and with a 6,500 mm/min belt speed to provide the selective-emitter photovoltaic cell of prior art such as shown in FIG. 1F.

The different main steps of the method for manufacturing a photovoltaic cell with a selective emitter according to the present invention are described hereafter in relation with FIGS. 2A to 2E. These drawings more particularly show the cross-section views of a photovoltaic cell in the different manufacturing steps according to the invention.

FIG. 2A shows a p-type silicon substrate (1), that is, a substrate lacking electrons, and thus having an excess of holes considered as positively charged. This substrate is generally obtained by doping of a silicon substrate by means of atoms belonging to the previous column of the periodic table of elements, such as boron.

Figure 2B:
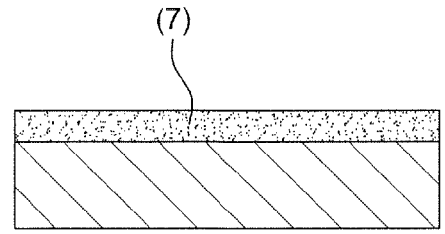

FIG. 2B illustrates the deposition of an n-doped antireflection layer (7) on the p-type silicon substrate (1). This antireflection layer (7) differs from the antireflection layer (2) of FIG. 1D (prior art) in that it comprises n-type dopants, that is, atoms having an excess of negatively-charged electrons. It may be a silicon nitride layer doped with phosphorus atoms. The deposition of SiN is generally performed by PECVD by means of an $NH_3/SiH_4$ mixture and in the presence of a flow of phosphine $PH_3$. Ammonia is used as a precursor gas, further enabling to improve the mobility of phosphorus atoms. Typically, the $NH_3/SiH_4$ molar ratio is between 1 and 20.

The p-doped silicon substrate is thus covered with an n-doped silicon nitride layer. Conversely to prior art, the antireflection layer is n doped.

FIG. 2C shows the forming of $n^{++}$ overdoped areas (6) within the substrate. The $n^{++}$ areas (6) may be formed by laser irradiation, preferably by pulsed laser, the pulse duration being in the order of a few tens of nanoseconds. The laser wavelength may be selected in the field extending from ultra-violet (excimer laser at 308 nm for example) to infrared (solid laser at 1,064 nm, for example). It preferably is a laser having a wavelength substantially equal to 515 nm.

The n doped antireflection layer (7) is locally irradiated to create heavily-doped areas.

According to this specific embodiment, the laser doping is associated with the partial removal of the antireflection layer. However, such a removal is not essential in the sense of the present invention.

FIG. 2D shows the deposition of conductive materials forming the electric contacts on the n areas (n contacts (3)) and on the p area (contact (4)). For more clarity, in FIGS. 2D and 2E, reference numerals (3) and (4) designate the conductive materials, that is, the electric contacts before anneal and the electric contacts formed after anneal.

Figure 2E:
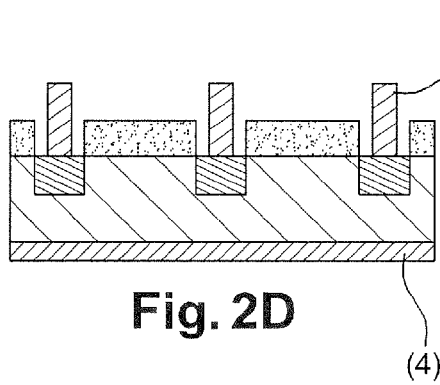
Figure 2E:
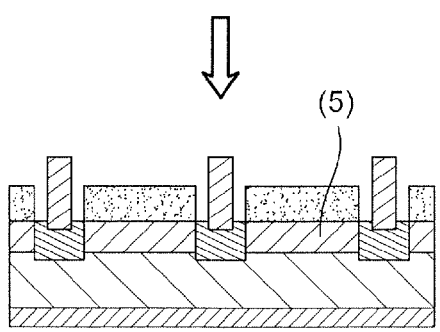

The conductive material forming the n contacts (3), typically made of silver, is deposited on the $n^{++}$ emitters (6). Although FIG. 2E illustrates n contacts (3) which are not in contact with the antireflection layer (7), they may also be in contact with the antireflection layer (7) according to another embodiment of the invention which is not presently illustrated. Generally, the p contacts (4) are made of aluminum. The electric contacts enable to collect the current subsequently generated by the photovoltaic cell.

Unlike in prior art, at this stage of the method, the $n^+$ emitter (5) has not been formed yet. Indeed, FIG. 2E relates to the forming of the $n^+$ emitter (5) by diffusion of the dopants of the antireflection layer (7) made of n-doped silicon nitride, simultaneously to the forming of the n contacts (3) and of the p contacts (4) by anneal.

This step comprises diffusing, in a single step at high temperature, the dopants contained in the SiN:P antireflection layer (7) to form the $n^+$ emitter (5), while forming the electric contacts by anneal of the n contacts (3) and of the p contacts (4), and the BSF activation.

This step may be performed in a continuous infrared furnace.

EMBODIMENTS OF THE INVENTION

A photovoltaic cell with a selective emitter is formed according to the following steps:
1. The surface of a p-type silicon substrate is chemically textured by soaking for 40 minutes in an aqueous solution, comprising 7% by volume of isopropanol, of potash (KOH 1%) at 80° C.
2. An antireflection layer having a 75-nm thickness made of phosphorus-doped silicon nitride, SiN:P (50 sccm of $PH_3$), is deposited on the upper surface of the p-doped substrate by PECVD (13.56 MHz at 300° C.) in the presence of a flow of $NH_3$ so that flow ratio $NH_3/SiH_4$ is in the range between 1 and 20 sccm ("Standard Cubic Centimeters per Minute").
3. Areas of the antireflection layer are selectively irradiated to form, by laser doping, the $n^{++}$ emitter. This laser doping is performed by means of a pulsed laser having a 515-nanometer wavelength. The pulse duration is 20 ns, with a 300-kHz rate, corresponding to a 1.7-W power. The diameter of the $n^{++}$ areas thus obtained is 40 micrometers for a laser firing. Areas of greater dimensions can be obtained by repeating the laser firing by displacing the point of impact.
4. Electric contacts are formed by silk-screening metallization.

The n contact in the form of juxtaposed lines is made of a silver paste (Dupont's PV142), mask opening 70 micrometers, opening step of 2.1 millimeters, aligned on the $n^{++}$ areas.

The p contact is formed of an aluminum paste (Monocrystal's PASE1202) deposited over the entire lower surface of the substrate. Such a contact forms an area of strong p doping providing the BSF phenomenon.
5. The forming by diffusion of the $n^+$ emitter and of the n contacts and of the p contacts are carried out in a single step in a Centrotherm infrared furnace, at a 1,000° C. temperature, and a passage speed of 4,000 mm/min.

The invention claimed is:

1. A method of manufacturing a photovoltaic cell with a selective emitter, comprising the steps of:
    depositing an antireflection layer comprising n-type dopants on an n- or p-type silicon substrate, said deposition being performed in the presence of a chemical compound enabling to accelerate the diffusion of n-type dopant atoms in said substrate;
    overdoping at least one area of the substrate to form at least one $n^{++}$ overdoped emitter by local diffusion of the n dopants of at least one area of the antireflection layer;
    depositing:
        of at least one n-type conductive material on the at least one $n^{++}$ overdoped emitter; and
        at least one p-type conductive material on the surface of the substrate opposite to that comprising the antireflection layer;
    forming n contacts and p contacts simultaneously to the forming of an $n^+$ emitter by an anneal capable of diffusing within the substrate n dopants from the antireflection layer.

2. The method of forming a photovoltaic cell with a selective emitter of claim 1, wherein the antireflection layer is made of silicon nitride.

3. The method of forming a photovoltaic cell with a selective emitter of claim 1, wherein the antireflection layer is phosphorus-doped.

4. The method of forming a photovoltaic cell with a selective emitter of claim 1, wherein the chemical compound enabling to accelerate the diffusion of the n-type dopant atoms is ammonia, $NH_3$.

5. The method of forming a photovoltaic cell with a selective emitter of claim 1, wherein the at least one $n^{++}$ emitter is formed by laser doping.

6. The method of forming a photovoltaic cell with a selective emitter of claim 5, wherein the laser pulses last from 10 ps to 1 μs.

7. The method of forming a photovoltaic cell with a selective emitter of claim 5, wherein the laser has a wavelength substantially equal to 515 nm.

8. The method of forming a photovoltaic cell with a selective emitter of claim 6, wherein the laser has a wavelength substantially equal to 515 nm.

9. The method of forming a photovoltaic cell with a selective emitter of claim 5, wherein the at least one $n^{++}$ emitter is formed by irradiation by laser.

10. The method of forming a photovoltaic cell with a selective emitter of claim 9, wherein the pulsed laser has a wavelength which is selected from the range extending from ultraviolet to infrared.

11. The method of forming a photovoltaic cell with a selective emitter of claim 1, wherein the n or p-type conductive materials are deposited by silk screening.

12. The method of forming a photovoltaic cell with a selective emitter of claim 1, wherein the $n^+$ emitter and the contacts and are simultaneously formed by anneal in an infrared furnace, at a temperature between 850 and 1050° C., and at a passage speed between 2,000 and 6,500 mm/min.

13. The method of forming a photovoltaic cell with a selective emitter of claim 1, wherein the substrate has a thickness between 50 micrometers and 500 micrometers.

14. The method of forming a photovoltaic cell with selective emitter of claim 1, wherein the antireflection layer has a thickness between 20 nanometers and 100 nanometers.

* * * * *